United States Patent
You

(10) Patent No.: US 12,062,406 B2
(45) Date of Patent: Aug. 13, 2024

(54) STORAGE DEVICE AND OPERATING METHOD THEREOF

(71) Applicant: SK hynix Inc., Gyeonggi-do (KR)

(72) Inventor: Byoung Sung You, Gyeonggi-do (KR)

(73) Assignee: SK hynix Inc., Gyeonggi-do (KR)

(*) Notice: Subject to any disclaimer, the term of this patent is extended or adjusted under 35 U.S.C. 154(b) by 675 days.

(21) Appl. No.: 17/231,589

(22) Filed: Apr. 15, 2021

(65) Prior Publication Data

US 2021/0265004 A1 Aug. 26, 2021

Related U.S. Application Data

(63) Continuation-in-part of application No. 16/938,603, filed on Jul. 24, 2020, now Pat. No. 11,481,128.

(30) Foreign Application Priority Data

Feb. 25, 2020 (KR) ........................ 10-2020-0023128

(51) Int. Cl.
*G11C 29/42* (2006.01)
*G11C 16/10* (2006.01)
(Continued)

(52) U.S. Cl.
CPC ............ *G11C 29/42* (2013.01); *G11C 16/102* (2013.01); *G11C 16/16* (2013.01); *G11C 16/26* (2013.01);
(Continued)

(58) Field of Classification Search
CPC ....... G11C 29/42; G11C 16/102; G11C 16/16; G11C 16/26; G11C 29/20;
(Continued)

(56) References Cited

U.S. PATENT DOCUMENTS

| 6,704,835 B1 | 3/2004 | Garner |
| 2013/0138912 A1 | 5/2013 | Bux et al. |

(Continued)

FOREIGN PATENT DOCUMENTS

| KR | 10-2016-0042287 | 4/2016 |
| KR | 10-2016-0049200 | 5/2016 |

(Continued)

OTHER PUBLICATIONS

Office Action issued by the USPTO on Oct. 5, 2021.

*Primary Examiner* — Charles Rones
*Assistant Examiner* — Jonah C Krieger
(74) *Attorney, Agent, or Firm* — IP & T GROUP LLP

(57) ABSTRACT

A memory device includes memory blocks, a read count storage, a cell counter, and a read reclaim processor. The read count storage stores read count information including read counts of the memory blocks. When a read count of a target block among the memory blocks exceeds at least one threshold count, the cell counter performs a read operation on at least one page among pages included in the target block by using a first read voltage, and calculates a first memory cell count as a number of memory cells read as first memory cells among memory cells included in the at least one page, based on a current sensed from the at least one page in the read operation. The read reclaim processor provides a memory controller with a status code based on the first memory cell count and a number of correctable error bits.

18 Claims, 14 Drawing Sheets

(51) Int. Cl.
  *G11C 16/16* (2006.01)
  *G11C 16/26* (2006.01)
  *G11C 29/20* (2006.01)
  *G11C 29/50* (2006.01)

(52) U.S. Cl.
  CPC ........ *G11C 29/20* (2013.01); *G11C 29/50004* (2013.01)

(58) Field of Classification Search
  CPC .......... G11C 29/50004; G11C 11/5642; G11C 29/52; G11C 16/0483; G11C 2029/0409; G11C 2029/0411; G11C 16/3495
  See application file for complete search history.

(56) References Cited

U.S. PATENT DOCUMENTS

| | | | |
|---|---|---|---|
| 2014/0101372 A1 | 4/2014 | Jung et al. | |
| 2015/0355845 A1* | 12/2015 | Lee | G06F 3/0659 |
| | | | 711/103 |
| 2019/0163313 A1* | 5/2019 | Kim | G06F 3/0412 |
| 2019/0287629 A1* | 9/2019 | Bang | G06F 11/1068 |
| 2019/0325485 A1* | 10/2019 | Tully | G06F 16/337 |
| 2020/0064898 A1 | 2/2020 | Shen et al. | |
| 2020/0110708 A1* | 4/2020 | Ma | G06F 12/0246 |
| 2020/0212935 A1* | 7/2020 | Luo | G06F 11/1076 |

FOREIGN PATENT DOCUMENTS

| | | |
|---|---|---|
| KR | 10-2016-0064849 | 6/2016 |
| KR | 10-2019-0073017 | 6/2019 |
| KR | 10-2022-0020731 A | 2/2022 |

\* cited by examiner

| BLK1 | BLK2 | BLK3 | ··· | BLKn |
|---|---|---|---|---|
| RD_Count1 | RD_Count2 | RD_Count3 | ··· | RD_Countn |

| ratio(x) | Status | Status Code |
|---|---|---|
| TH_ratio2≤x | S3(in danger) | 10 |
| TH_ratio1≤x<TH_ratio2 | S2(at stake) | 01 |
| x<TH_ratio1 | S1(safe) | 00 |

STORAGE DEVICE AND OPERATING METHOD THEREOF

CROSS-REFERENCE TO RELATED APPLICATION

This application is a continuation-in-part of U.S. Patent Application Ser. No. 16/938,603 filed on Jul. 24, 2020 which claims benefits of priority of Korean Patent Application No. 10-2020-0023128, filed on Feb. 25, 2020. The disclosure of each of the applications is incorporated herein by reference in its entirety.

BACKGROUND

Field of Invention

The present disclosure generally relates to an electronic device, and more particularly, to a storage device and an operating method thereof.

Description of Related Art

A storage device stores data under the control of a host device such as a computer or a smart phone. A storage device may include a memory device for storing data and a memory controller for controlling the memory device. A memory device may be a volatile memory device or a nonvolatile memory device.

A volatile memory device stores data only when power is supplied; stored data disappears when the supply of power is interrupted. Examples of volatile memory devices include a Static Random Access Memory (SRAM), a Dynamic Random Access Memory (DRAM), and the like.

A nonvolatile memory device continues to store data even when the supply of power is interrupted. Examples of nonvolatile memory devices include a Read Only Memory (ROM), a Programmable ROM (PROM), an Electrically Programmable ROM (EPROM), an Electrically Erasable ROM (EEROM), a flash memory, and the like.

SUMMARY

Embodiments provide a storage device having improved read reclaim performance and an operating method thereof.

In accordance with an aspect of the present disclosure, there is provided a memory device including: a plurality of memory blocks; a read count storage configured to store read count information including a read count of each of the plurality of memory blocks; and a read reclaim processor configured to provide a memory controller with a status read response including a status code representing a priority order of a read reclaim operation on a target block, in response to a status read command received from the memory controller.

In accordance with another aspect of the present disclosure, there is provided a method for operating a memory device including a plurality of memory blocks, the method including: performing a read operation on a target block among the plurality of memory blocks in response to a read command received from a memory controller; and providing the memory controller with a status read response including a status code representing a priority order of a read reclaim operation on the target block, in response to a status read command received from the memory controller.

In accordance with still another aspect of the present disclosure, there is provided a storage device including: a memory device including a plurality of memory blocks; and a memory controller configured to control the memory device to perform a read operation on a target block among the plurality of memory blocks, and receive, from the memory device, a status read response including a status code representing a priority order of a read reclaim operation of the target block.

Embodiments provide a memory device having improved read reclaim performance and an operating method thereof.

In accordance with an aspect of the present disclosure, there is provided a memory device including: a read count storage configured to store read count information including read counts of the plurality of memory blocks; a cell counter configured to, when a read count of a target block among the plurality of memory blocks exceeds at least one threshold count, perform a read operation on at least one page among a plurality of pages included in the target block by using a first read voltage, and calculate a first memory cell count as a number of memory cells read as first memory cells among memory cells included in the at least one page, based on a current sensed from the at least one page in the read operation; and a read reclaim processor configured to provide a memory controller with a status code representing a priority order of a read reclaim operation on the target block, based on the first memory cell count and a number of correctable error bits.

In accordance with another aspect of the present disclosure, there is provided a method for operating a memory device including a plurality of memory blocks, the method comprising: performing a first read operation on a target block among the plurality of memory blocks in response to a read command received from a memory controller; performing a second read operation on at least one page among a plurality of pages included in the target block by using a first read voltage according to whether a read count of the target block has exceeded at least one threshold count; sensing a current from the at least one page in the second read operation; calculating a first memory cell count as a number of memory cells read as first memory cells among memory cells included in the at least one page, based on the sensed current; and providing the memory controller with a status code representing a priority order of a read reclaim operation on the target block, based on the first memory cell count and a number of correctable error bits.

BRIEF DESCRIPTION OF THE DRAWINGS

Example embodiments are described more fully hereinafter with reference to the accompanying drawings; however, features and aspects of the present invention may be configured and/or arranged differently than disclosed herein. Thus, the present invention is not limited to or by any of the embodiments set forth herein. Rather, these embodiments are provided so that this disclosure is thorough and complete, and fully conveys the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Specific structural and functional description provided herein is merely for the purpose of describing embodiments according to the present invention. Embodiments of the present invention can be implemented in various forms and ways. Thus, as the present invention is not limited to or by any of the embodiments set forth herein. Also, throughout the specification, reference to "an embodiment," "another embodiment" or the like is not necessarily to only one embodiment, and different references to any such phrase are not necessarily to the same embodiment(s).

Figure 1:
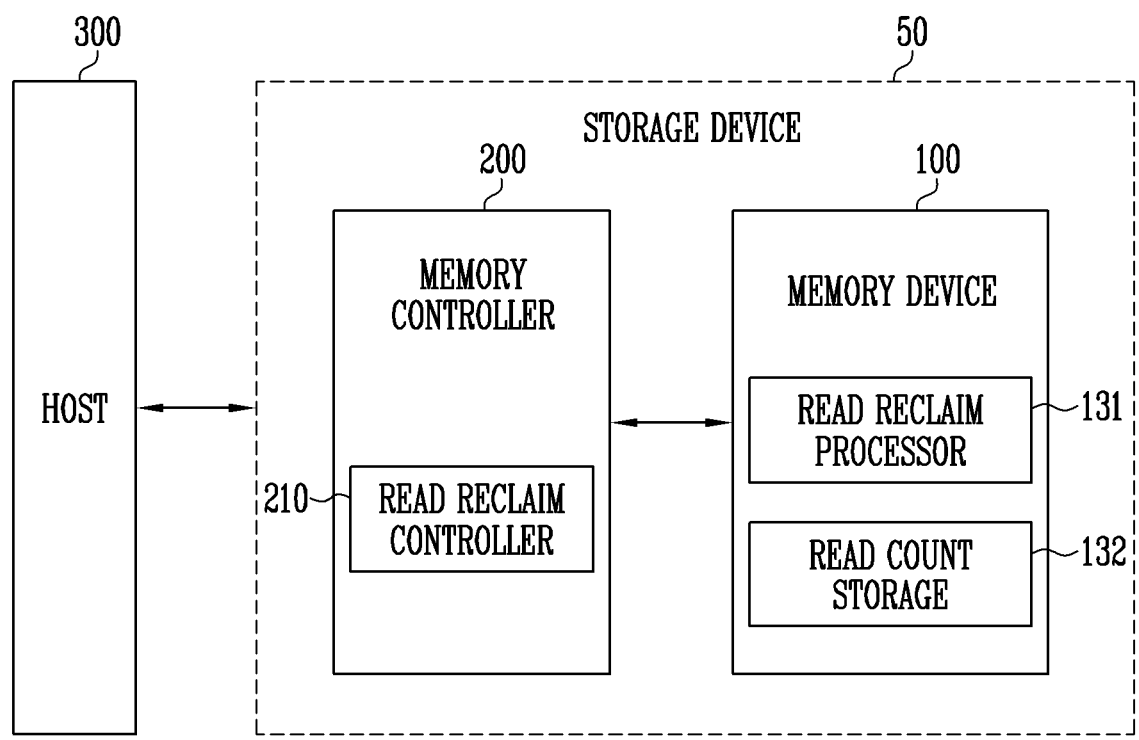
FIG. 1 is a diagram illustrating a storage device in accordance with an embodiment of the present disclosure.

FIG. 1 is a diagram illustrating a storage device in accordance with an embodiment of the present disclosure.

Referring to FIG. 1, the storage device 50 may include a memory device 100 and a memory controller 200 configured to control the memory device 100. The storage device 50 may store data under the control of a host 300, such as a mobile phone, a smart phone, an MP3 player, a laptop computer, a desktop computer, a game console, a TV, a tablet PC or an in-vehicle infotainment.

The storage device 50 may be configured as any of various types of storage devices according to a host interface that is a communication scheme with the host 300. For example, the storage device 50 may be implemented as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), and/or a memory stick.

The storage device 50 may be manufactured as any of various kinds of package types. For example, the storage device 50 may be manufactured as a Package-On-Package (POP), a System-In-Package (SIP), a System-On-Chip (SOC), a Multi-Chip Package (MCP), a Chip-On-Board (COB), a Wafer-level Fabricated Package (WFP), and/or a Wafer-level Stack Package (WSP).

The memory device 100 may store data. The memory device 100 operates under the control of the memory controller 200. The memory device 100 may include a memory cell array including a plurality of memory cells for storing data.

Each of the memory cells may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The memory cell array may include a plurality of memory blocks, each of which may include a plurality of memory cells. One memory block may include a plurality of pages. In an embodiment, the page may be a unit for storing data in the memory device 100 or reading data stored in the memory device 100.

The memory block may be a unit for erasing data. In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In this specification, by way of example, features and aspects of the invention are described in the context in which the memory device 100 is a NAND flash memory.

The memory device 100 receives a command and an address from the memory controller 200 and accesses an area selected by the address in the memory cell array. That is, the memory device 100 may perform an operation instructed by the command on the area selected by the address. For example, the memory device 100 may perform a write (program) operation, a read operation, and an erase operation. In the program operation, the memory device 100 may program data in the area selected by the address. In the read operation, the memory device 100 may read data from the area selected by the address. In the erase operation, the memory device 100 may erase data stored in the area selected by the address.

In an embodiment, the memory device 100 may include a read reclaim processor 131 and a read count storage 132.

The read reclaim processor 131 may provide the memory controller 200 with a status read response including a status code in response to a status read command received from the memory controller 200. The status read command may be for checking an operating status of the memory device. The status code may indicate a priority order of a read reclaim operation on a target block on which a read operation is performed. That is, the status code may indicate whether the read claim operation is to be performed on the target block, and if so, how it is to be performed. The read reclaim operation may include copying data stored in the target block to another block. Alternatively, the read reclaim operation may include moving data stored in the target block to another block through garbage collection.

A plurality of memory blocks may store read count information. In an embodiment, each of the memory blocks may store a read count that indicates the number of times a read operation has been performed on that memory block. In an embodiment, the read count information may be stored in a meta area of each of the plurality of memory blocks. In another embodiment, the read count information may be stored in system blocks among the plurality of memory blocks.

The read reclaim processor 131 may load read count information stored in a plurality of memory blocks to the read count storage 132, when power is applied to the memory device 100.

The read reclaim processor 131 may update the read count information loaded to the read count storage 132 in response to a read command received from the memory controller 200. For example, the read reclaim processor 131 may update a read count of a target block on which a read operation is performed according to the read command.

The read reclaim processor 131 may determine a status code, based on the result of a comparison of the read count of the target block and at least one threshold count. In an embodiment, the status code may represent one of first to third status codes. The first status code may indicate that a read reclaim operation on the target block is unnecessary. The second status code may indicate that the read reclaim operation is to be performed as a background operation. The third status code may indicate that the read reclaim operation is to be performed as a foreground operation. The number of status codes is not limited to the three described above.

The read reclaim processor 131 may again store, in the plurality of memory blocks, the read count information loaded to the read count storage 132 before the power supplied to the memory device 100 is interrupted.

The read count storage 132 may store read count information read from a plurality of memory blocks. Whenever a read operation is performed on any of the plurality of memory blocks, the read count information stored in the read count storage 132 may be updated. The updated read count information may be again stored in the plurality of memory blocks before the power supplied to the memory device 100 is interrupted.

The memory controller 200 may control overall operation of the storage device 50.

When power is applied to the storage device 50, the memory controller 200 may execute firmware (FW). When the memory device 100 is a flash memory device, the memory controller 200 may execute FW such as a Flash Translation Layer (FTL) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells in the memory device 100, in which data is to be stored.

The memory controller 200 may control the memory device 100 to perform a program operation, a read operation, an erase operation, or the like in response to a request from the host 300. In the program operation, the memory controller 200 may provide a program command, a PBA, and data to the memory device 100. In the read operation, the memory controller 200 may provide a read command and a PBA to the memory device 100. In the erase operation, the memory controller 200 may provide an erase command and a PBA to the memory device 100.

In an embodiment, the memory controller 200 may autonomously generate a command, an address, and data in the absence of a request from the host 300, and transmit the command, the address, and the data to the memory device 100. For example, the memory controller 200 may provide the autonomously-generated command, the address, and the data to the memory device 100 to perform background operations such as wear leveling and garbage collection.

In an embodiment, the memory controller 200 may control at least two memory devices 100. The memory controller 200 may control the memory devices according to an interleaving scheme so as to improve operational performance. The interleaving scheme may be an operating scheme that allows each of at least two memory devices 100 to perform at least a portion of an operation at the same time.

In an embodiment, the memory controller 200 may include a read reclaim controller 210.

The read reclaim controller 210 may provide a status read command to the memory device 100. The status read command may be for checking an operating status of the memory device 100. The read reclaim controller 210 may receive a status read response to the status read command from the memory device 100. The status read response may include a status code representing a priority order of a read reclaim operation of a target block on which a read operation is performed.

The read reclaim controller 210 may control the memory device 100 to perform the read reclaim operation on the target block based on the status code.

Specifically, when the status code is a first status code, the read reclaim controller 210 may control the memory device 100 to not perform the read reclaim operation on the target block.

When the status code is a second status code, the read reclaim controller 210 may control the memory device to perform the read reclaim operation on the target block as a background operation. That is, the read reclaim controller 210 may control the memory device 100 to perform the read reclaim operation on the target block when the memory device 100 is in an idle state. In the idle state, the memory device 100 does not perform any operation according to a request from the host 300.

When the status code is a third status code, the read reclaim controller 210 may control the memory device 100 to perform the read reclaim operation as a foreground operation. That is, the read reclaim controller 210 may control the memory device 100 to preferentially perform the read reclaim operation on the target block, with respect to another read, program or erase operation.

The host 300 may communicate with the storage device 50, using at least one of various communication protocols, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a universal flash storage (UFS), a Secure Digital (SD), a Multi-Media Card (MMC), an embedded MMC (eMMC), a Dual In-line Memory Module (DIMM), a Registered DIMM (RDIMM), and/or a Load Reduced DIMM (LRDIMM).

Figure 2:
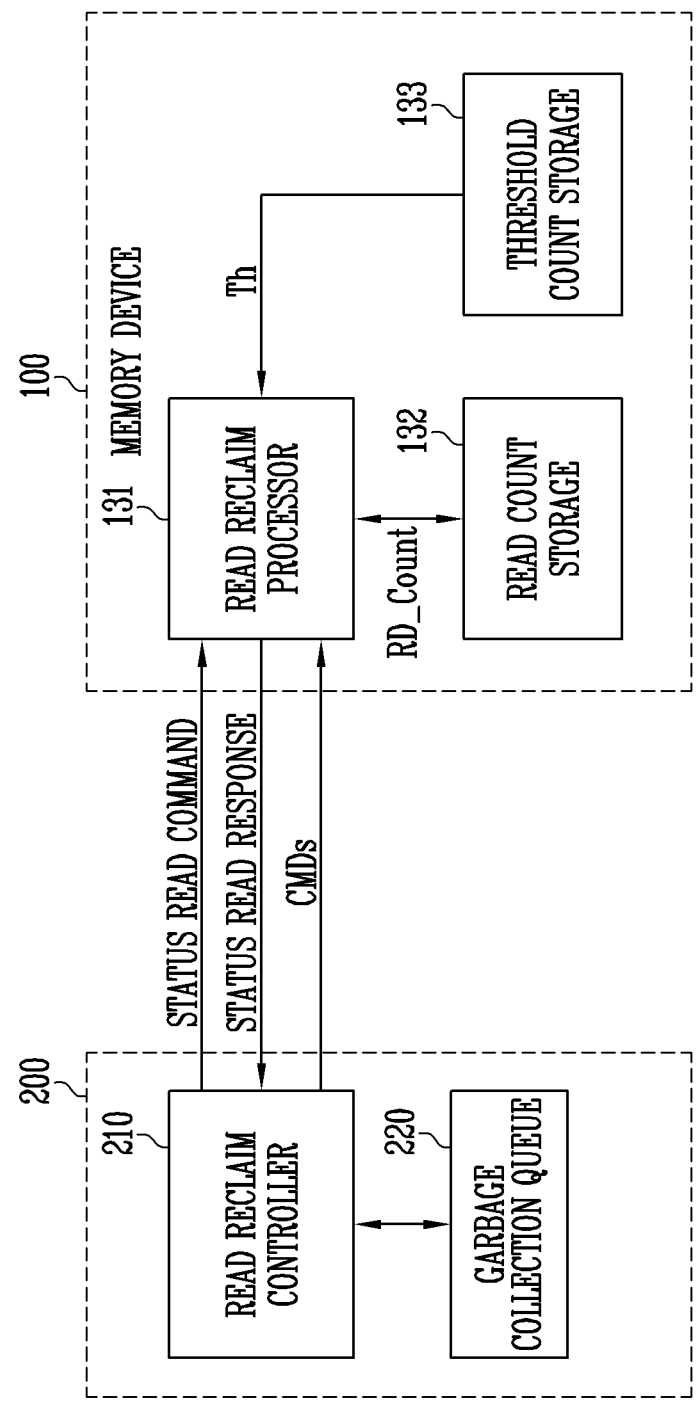
FIG. 2 is a diagram illustrating a configuration and an operation of a storage device, such as that shown in FIG. 1.

FIG. 2 is a diagram illustrating a configuration and an operation of the storage device shown in FIG. 1.

Referring to FIG. 2, the storage device may include a memory device 100 and a memory controller 200. The memory device 100 may include a read reclaim processor 131, a read count storage 132, and a threshold count storage 133. The memory controller 200 may include a read reclaim controller 210 and a garbage collection queue 220.

The read reclaim processor 131 may provide the read reclaim controller 210 with a status read response including a status code in response to a status read command received from the read reclaim controller 210. The status read command may be for checking an operating status of the memory device 100. The status code may represent a priority order of a read reclaim operation on a target block on which a read operation is performed.

The read reclaim processor 131 may receive at least one threshold count Th from the threshold count storage 133. The read reclaim processor 131 may receive a read count RD_Count of the target block from the read count storage 132. RD_Count for a particular block, e.g., a target block, indicates how many times a read operation has been performed on that block.

The read reclaim processor 131 may determine a status code, based on the result of a comparison of the read count RD_Count of the target block and the at least one threshold count Th.

In an embodiment, the status code may be any of three status codes, i.e., first to third status codes, which indicate various levels of priority in performing a read reclaim operation. However, the present invention is not limited to any specific number of status codes. When the read count RD_Count of the target block is smaller than a first threshold count, the status code may be the first status code. When the read count RD_Count of the target block is greater than or equal to the first threshold count and is smaller than a second threshold count, the status code may be the second status code. When the read count RD_Count of the target block is greater than or equal to the second threshold count, the status code may be the third status code.

In an embodiment, the first status code may indicate that the read reclaim operation on the target block is unnecessary. The second status code may indicate that performance of the read reclaim operation is to be performed as a background operation. The third status code may indicate that performance of the read reclaim operation is to be performed as a foreground operation.

The read reclaim processor 131 may provide the read reclaim controller 210 with the status read response including the determined status code.

The read reclaim processor 131 may load read count information stored in a plurality of memory blocks to the read count storage 132, when power is applied to the memory device 100. The read count information may include a read count of each of the plurality of memory blocks.

The read reclaim processor 131 may update the read count information loaded to the read count storage 132 in response to a read command received from the memory controller 200. For example, the read claim processor 131 may update a read count of a target block, which is included in the read count information in response to the read command. The target block may be a memory block on which a read operation is performed according to the read command.

The read reclaim processor 131 may again store, in the plurality of memory blocks, the read count information loaded to the read count storage 132 before the power supplied to the memory device 100 is interrupted.

The read count storage 132 may store read count information loaded from a plurality of memory blocks. Whenever a read operation is performed on any of the plurality of memory blocks, the read count information stored in the read count storage 132 may be updated. The updated read count information may be again stored in the plurality of memory blocks before the power supplied to the memory device 100 is interrupted.

The threshold count storage 133 may store at least one threshold count Th. Each threshold count Th may be set when the storage device is manufactured. In another embodiment, each threshold count Th may be changed from its factory set default value depending on a setting command of the memory controller 200.

The read reclaim controller 210 may provide a status read command to the read reclaim processor 131. The status read command may be for checking an operating status of the memory device 100. The read reclaim controller 210 may receive a status read response to the status read command from the read reclaim processor 131. The status read response may include a status code representing a priority order, e.g., the relative priority, of a read reclaim operation of a target block on which a read operation is performed.

The read reclaim controller 210 may control the memory device 100 to perform the read reclaim operation on the target block based on the status code.

Specifically, when the status code is the first status code, the read reclaim controller 210 may not generate a command for the read reclaim operation on the target block. Thus, in this case, the read reclaim operation is not performed on the target block.

When the status code is the second status code, the read reclaim controller 210 may generate commands for the read reclaim operation, and store the generated commands in the garbage collection queue 220. The read reclaim controller 210 may provide the memory device 100 with commands for the read reclaim operation, which are queued in the garbage collection queue 220 when the memory device 100 is in an idle state.

When the status code is the third status code, the read reclaim controller 210 may preferentially provide commands for the read reclaim operation to the memory device 100, as compared with commands generated before the commands for the read reclaim operation.

Figure 3:
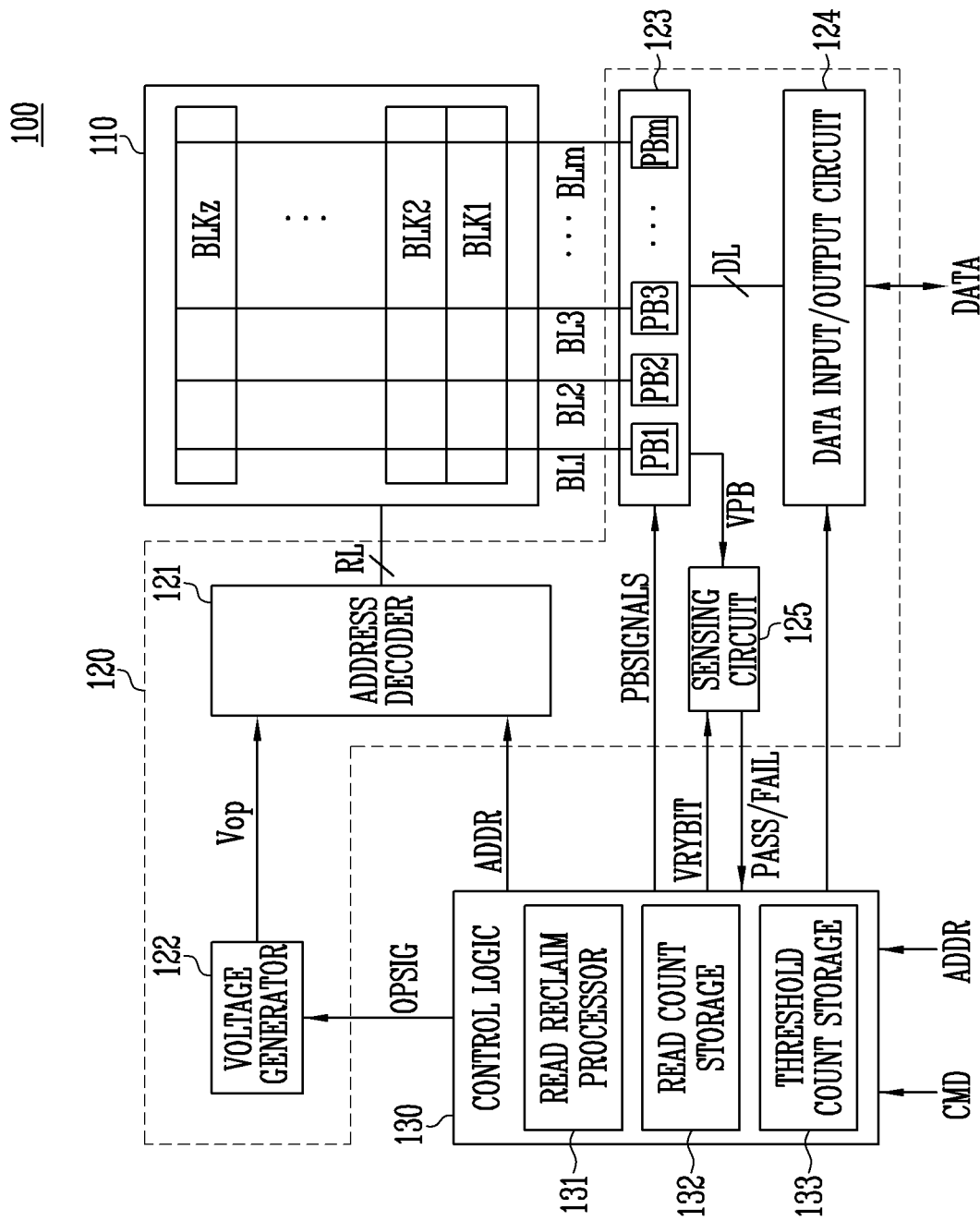
FIG. 3 is a diagram illustrating a structure of a memory device, such as that shown in FIG. 1.

FIG. 3 is a diagram illustrating a structure of the memory device shown in FIG. 1.

Referring to FIG. 3, the memory device 100 may include a memory cell array 100, a peripheral circuit 120, and control logic 130.

The memory cell array 110 includes a plurality of memory blocks BLK1 to BLKz, which are coupled to an address decoder 121 through row lines RL. The plurality of memory blocks BLK1 to BLKz are coupled to a read/write circuit 123 through bit lines BL1 to BLm. Each of the plurality of memory blocks BLK1 to BLKz includes a plurality of memory cells. In an embodiment, the plurality of memory cells may be nonvolatile memory cells. Memory cells coupled to the same word line among the plurality of memory cells may be defined as one physical page. That is, the memory cell array 110 may be configured with a plurality of physical pages. In accordance with an embodiment of the present disclosure, each of the plurality of memory blocks BLK1 to BLKz in the memory cell array 110 may include a plurality of dummy cells. One or more dummy cells may be coupled in series between a drain select transistor and memory cells and between a source select transistor and the memory cells.

Each of the memory cells of the memory device may be configured as a Single Level Cell (SLC) storing one data bit, a Multi-Level Cell (MLC) storing two data bits, a Triple Level Cell (TLC) storing three data bits, or a Quad Level Cell (QLC) storing four data bits.

The peripheral circuit 120 may include the address decoder 121, a voltage generator 122, the read/write circuit 123, a data input/output circuit 124, and a sensing circuit 125.

The peripheral circuit 120 drives the memory cell array 110. For example, the peripheral circuit 120 may drive the memory cell array 110 to perform a program operation, a read operation, and an erase operation.

The address decoder 121 is coupled to the memory cell array 110 through the row lines RL. The row lines RL may include drain select lines, word lines, source select lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may operate under the control of the control logic 130. The address decoder 121 receives an address ADDR from the control logic 130.

The address decoder 121 may decode a block address in the received address ADDR. The address decoder 121 selects at least one memory block among the memory blocks BLK1 to BLKz according to the decoded block address. The address decoder 121 may decode a row address in the received address ADDR. The address decoder 121 may select at least one word line among word lines of a memory block selected according to the decoded row address. The address decoder 121 may apply an operating voltage Vop supplied from the voltage generator 122 to the selected word line.

In a program operation, the address decoder 121 may apply a program voltage to the selected word line, and apply a pass voltage having a level lower than that of the program voltage to unselected word lines. In a program verify operation, the address decoder 121 may apply a verify voltage to the selected word line, and apply a verify pass voltage having a level higher than that of the verify voltage to the unselected word lines.

In a read operation, the address decoder 121 may apply a read voltage to the selected word line, and apply a read pass voltage having a level higher than that of the read voltage to the unselected word lines.

In accordance with an embodiment of the present disclosure, an erase operation of the memory device 100 is performed in units of memory blocks. In an erase operation, the address ADDR input to the memory device 100 includes a block address. The address decoder 121 may decode the block address and select at least memory block according to the decoded block address. In the erase operation, the address decoder 121 may apply a ground voltage to word lines coupled to the selected memory block.

In accordance with an embodiment of the present disclosure, the address decoder 121 may decode a column address in the address ADDR transmitted thereto. The decoded column address may be transmitted to the read/write circuit 123. In an example, the address decoder 121 may include components such as a row decoder, a column decoder, and an address buffer.

The voltage generator 122 may generate a plurality of operating voltages Vop by using an external power voltage supplied to the memory device 100. The voltage generator 122 operates under the control of the control logic 130.

In an embodiment, the voltage generator 122 may generate an internal power voltage by regulating the external power voltage. The internal power voltage generated by the voltage generator 122 is used as an operation voltage of the memory device 100.

In an embodiment, the voltage generator 122 may generate a plurality of operating voltages Vop by using the external power voltage or the internal power voltage. The voltage generator 122 may generate various voltages required by the memory device 100. For example, the voltage generator 122 may generate a plurality of erase voltages, a plurality of program voltages, a plurality of pass voltages, a plurality of select read voltages, and a plurality of unselect read voltages.

In order to generate a plurality of operating voltages Vop having various voltage levels, the voltage generator 122 may include a plurality of pumping capacitors for receiving the internal power voltage, and generate the plurality of operating voltages Vop by selectively activating the plurality of pumping capacitors under the control of the control logic 130. The plurality of generated voltages Vop may be supplied to the memory cell array 110 by the address decoder 121.

The read/write circuit 123 includes first to mth page buffers PB1 to PBm, which are coupled to the memory cell array 110 through the first to mth bit lines BL1 to BLm, respectively. The first to mth page buffers PB1 to PBm operate under the control of the control logic 130.

The first to mth page buffers PB1 to PBm communicate data DATA with the data input/output circuit 124. In a program operation, the first to mth page buffers PB1 to PBm receive data DATA to be stored through the data input/output circuit 124 and data lines DL.

In a program operation, the first to mth page buffers PB1 to PBm may transfer, to selected memory cells through the bit lines BL1 to BLm, data DATA received through the data input/output circuit 124 when a program pulse is applied to a selected word line. The memory cells of the selected memory cells are programmed according to the transferred data DATA. A memory cell coupled to a bit line through which a program allow voltage (e.g., a ground voltage) is applied may have an increased threshold voltage. A threshold voltage of a memory cell coupled to a bit line through which a program inhibit voltage (e.g., a power voltage) is applied may be maintained. In a program verify operation, the first to mth page buffers PB1 to PBm read data DATA stored in the selected memory cells from the selected memory cells through the bit lines BL1 to BLm.

In a read operation, the read/write circuit 123 may read data DATA from memory cells of a selected page through the bit lines BL, and store the read data DATA in the first to mth page buffers PB1 to PBm.

In an erase operation, the read/write circuit 123 may float the bit lines BL. In an embodiment, the read/write circuit 123 may include a column select circuit.

The data input/output circuit 124 is coupled to the first to mth page buffers PB1 to PBm through the data lines DL. The data input/output circuit 124 operates under the control of the control logic 130.

The data input/output circuit 124 may include a plurality of input/output buffers (not shown) that receive input data DATA. In a program operation, the data input/output circuit 124 may receive data DATA to be stored from an external controller (not shown). In a read operation, the data input/output circuit 124 outputs, to the external controller, data transmitted from the first to mth page buffers PB1 to PBm included in the read/write circuit 123.

In a read operation or verify operation, the sensing circuit 125 may generate a reference current in response to an allow bit VRYBIT signal generated by the control logic 130, and output a pass signal or fail signal to the control logic 130 by comparing a sensing voltage VPB received from the read/ write circuit 123 and a reference voltage generated by the reference current. In an embodiment, the sensing circuit 125 may be a current sensing circuit (CSC).

The control logic 130 may be coupled to the address decoder 121, the voltage generator 122, the read/write circuit 123, the data input/output circuit 124, and the sensing circuit 125. The control logic 130 may control overall operation of the memory device 100. The control logic 130 may operate in response to a command CMD transferred from an external device.

The control logic 130 may control the peripheral circuit 120 by generating several signals in response to a command CMD and an address ADDR. For example, the control logic 130 may generate an operation signal OPSIG, a row address RADD, a read/write circuit control signal PBSIGNALS, and an allow bit VRYBIT in response to the command CMD and the address ADDR. The control logic 130 may output the operation signal OPSIG to the voltage generator 122, output the row address RADD to the address decoder 121, output the read/write circuit control signal PBSIGNALS to the read/write circuit 123, and output the allow bit VRYBIT to the sensing circuit 125. Also, the control logic 130 may determine whether the verify operation has passed or failed in response to the pass or fail signal PASS/FAIL output by the sensing circuit 125.

In an embodiment, the control logic 130 may include the read reclaim processor 131, the read count storage 132, and the threshold count storage 133, which are described with reference to FIG. 2. In various embodiments, the read count storage 132 and the threshold count storage 133 may be located outside of the control logic 130. The read count storage 132 and the threshold count storage 133 may include a register circuit.

Figure 4:
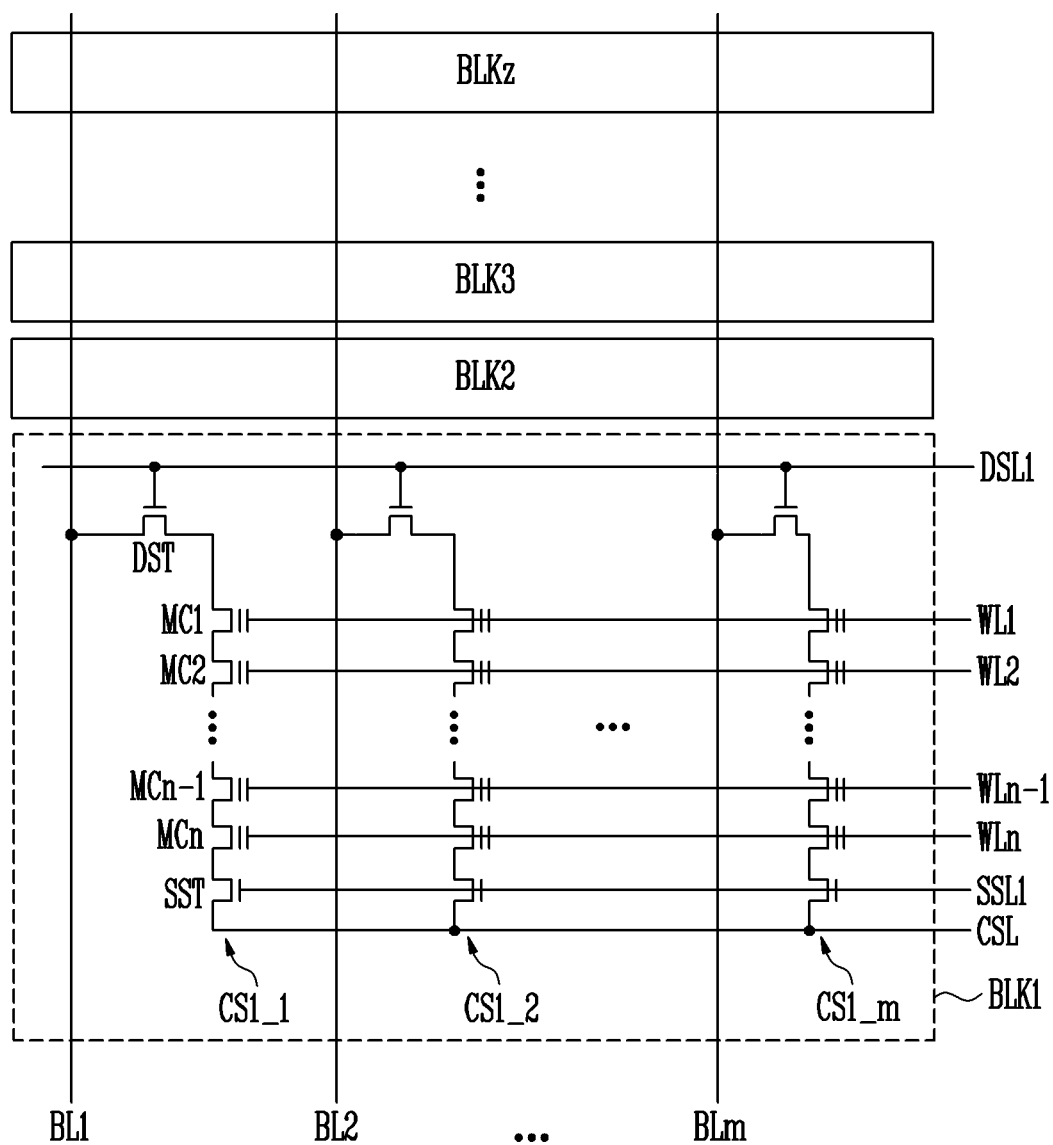
FIG. 4 is a diagram illustrating a memory cell array, such as that shown in FIG. 3.

FIG. 4 is a diagram illustrating the memory cell array shown in FIG. 3.

Referring to FIG. 4, first to zth memory blocks BLK1 to BLKz are commonly coupled to the first to mth bit lines BL1 to BLm. In FIG. 4, for clarity, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The memory block BLK1 may include a plurality of cell strings CS1_1 to CS1_m (m is a positive integer). First to mth cell strings CS1_1 to CS1_m are respectively coupled to the first to mth bit lines BL1 to BLm. Each of the first to mth cell strings CS1_1 to CS1_m includes a drain select transistor DST, a plurality of memory cells MC1 to MCn (n is a positive integer) coupled in series, and a source select transistor SST.

A gate terminal of the drain select transistor DST included in each of the first to mth cell strings CS1_1 to CS1_m is coupled to a drain select line DSL1. Gate terminals of first to nth memory cells MC1 to MCn included in each of the first to mth cell strings CS1_1 to CS1_m are respectively coupled to first to nth word lines WL1 to WLn. A gate terminal of the source select transistor SST included in each of the first to mth cell strings CS1_1 to CS1_m is coupled to a source select line SSL1.

For clarity, FIG. 4 illustrates a structure of the first cell string CS1_1 among the plurality of cell strings CS1_1 to CS1_m. However, it will be understood that each of the other cell strings CS1_2 to CS1_m is configured identically to the first cell string CS1_1.

A drain terminal of the drain select transistor DST in the first cell string CS1_1 is coupled to the first bit line BL1. A source electrode of the drain select transistor DST in the first cell string CS1_1 is coupled to a drain terminal of the first memory cell MC1 in the first cell string CS1_1. The first to nth memory cells MC1 to MCn are coupled in series. A drain terminal of the source select transistor SST included in the first cell string CS1_1 is coupled to a source terminal of the nth memory cell MCn in the first cell string CS1_1. A source terminal of the source select transistor SST in the first cell string CS1_1 is coupled to a common source line CSL. In an embodiment, the common source line CSL may be commonly coupled to the first to zth memory blocks BLK1 to BLKz.

The drain select line DSL1, the first to nth word lines WL1 to WLn, and the source select line SSL1 are included in the row lines RL shown in FIG. 3. The drain select line DSL1, the first to nth word lines WL1 to WLn, and the source select line SSL1 are controlled by the address decoder 121 shown in FIG. 3. The common source line CSL may be controlled by the control logic 130 shown in FIG. 3. The first to mth bit lines BL1 to BLm are controlled by the read/write circuit 123 shown in FIG. 3.

Figures 5, 6:
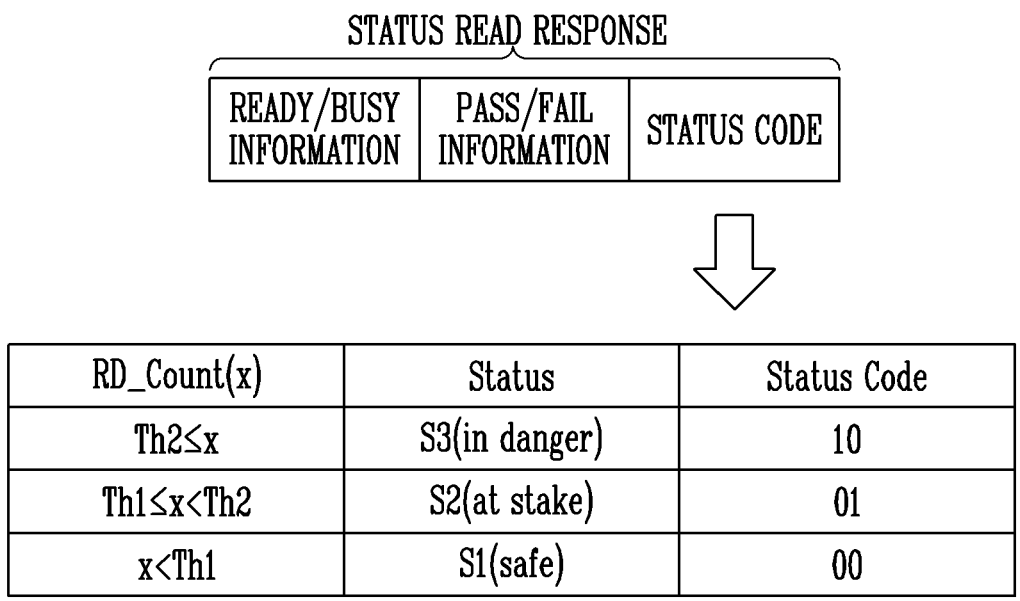
FIG. 5 is a diagram illustrating read count information, such as that shown in FIG. 2.
FIG. 6 is a diagram illustrating a status read response, such as that shown in FIG. 2.

FIG. 5 is a diagram illustrating the read count information shown in FIG. 2.

Referring to FIG. 5, the read count information may include read counts (RD_Count1 to RD_Countn) of a plurality of memory blocks (BLK1 to BLKn), respectively. In an embodiment, the read count information for each memory block may be stored in a meta area of the corresponding memory block. In another embodiment, the read count information may be stored in system blocks among the plurality of memory blocks.

After power is supplied to the memory device 100, the read count information stored in the plurality of memory blocks may be loaded to the read count storage 132. Whenever a read operation is performed on any of the plurality of memory blocks BLK1 to BLKn, the read count information in the read count storage 132 may be updated. In particular, the read count of the memory block just read may be incremented. Then, the read count information in the read count storage 132 may be again stored in the plurality of memory blocks before the power applied to the memory device 100 is interrupted.

In this manner, a read count may be maintained and managed for each memory block.

FIG. 6 is a diagram illustrating the status read response shown in FIG. 2.

Referring to FIGS. 2 and 6, the memory device 100 may provide a status read response to the memory controller 200 in response to a status read command received from the memory controller 200. The status read response may include ready/busy information, pass/fail information, and a status code.

The ready/busy information may represent a busy status in which the memory device 100 is performing an operation according to a command received from the memory controller 200 or a ready status in which the memory device is available to perform an operation in response to a new command received from the memory controller 200.

The pass/fail information may represent whether a program operation or erase operation that the memory device 100 is performing according to a command received from the memory controller 200 has passed or failed.

The status code may indicate a priority order of a read reclaim operation on a target block on which a read operation is performed according to a read command received from the memory controller 200.

In an embodiment, the status code may represent one of first to third status codes. The priority of the read reclaim operation may become higher from the first status code to the third status code. The present invention, however, is not limited to any particular number of status codes.

In an embodiment, the status code may be determined based on the result of a comparison of a read count RD_Count x of the target block and at least one threshold count Th.

For example, when the read count x of the target block is smaller than a first threshold count Th1, the status code may be the first status code. When the read count x is greater than or equal to the first threshold count Th and is smaller than a second threshold count Th2, the status code may be the second status code. When the read count x is greater than or equal to the second threshold count Th2, the status code may be the third status code.

The first status code may represent a safe status S1 indicating that the read reclaim operation on the target block is unnecessary. The second status code may represent a risky status S2 indicating that performance of the read reclaim operation is requested to be performed as a background operation. The third status code may represent a dangerous status S3 indicating that performance of the read reclaim operation is requested to be performed as a foreground operation.

In an embodiment, a value of the first status code may be 00. A value of the second status code may be 01. A value of the third status code may be 10. A value of the status code may be determined as a combination of field values of a specific position among field values constituting the status read response. For example, when the status read response is configured with field values of <0:7> bits, the value of the status code may be determined as a combination of field value <0> and field value <3>. The value of the status code and the method for determining the same are not limited to this embodiment.

Figure 7:
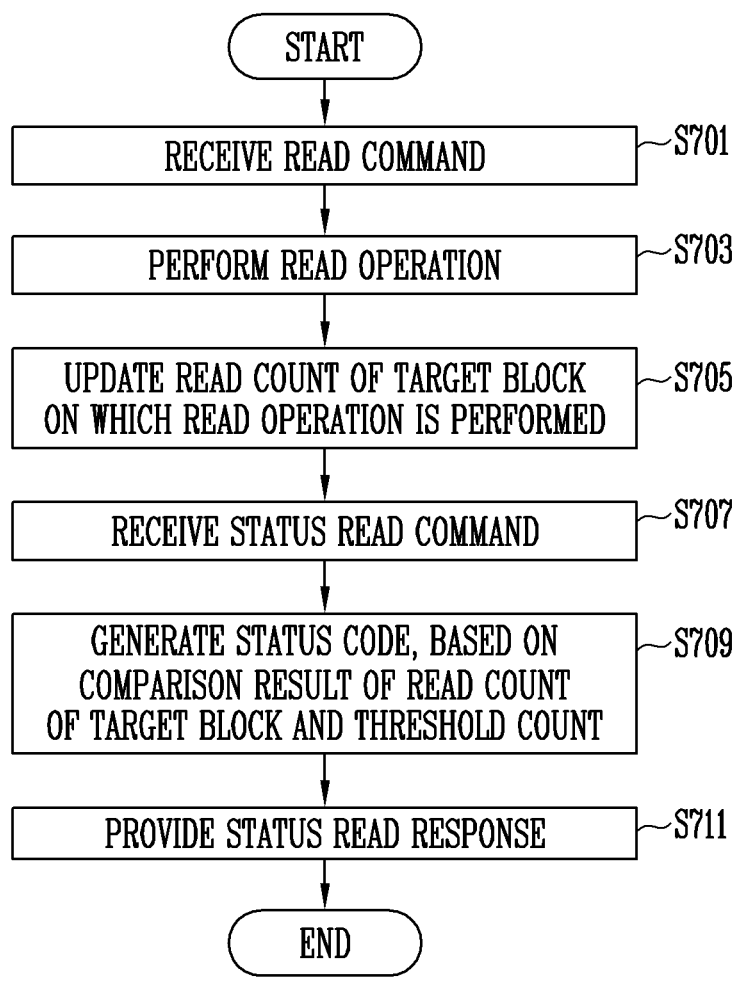
FIG. 7 is a flowchart illustrating an operation of a memory device in accordance with an embodiment of the present disclosure.

FIG. 7 is a flowchart illustrating an operation of the memory device in accordance with an embodiment of the present disclosure.

Referring to FIG. 7, in step S701, the memory device may receive a read command from the memory controller.

In step S703, the memory device may perform a read operation on a target block among a plurality of memory blocks in response to the read command. Specifically, the memory block may perform the read operation on a selected page among a plurality of pages in the target block.

In step S705, the memory device may update, i.e., increment, a read count of the target block on which the read operation is performed. Specifically, the memory device may update the read count of the target block, which is included in read count information loaded to the read count storage 132.

In step S707, the memory device may receive a status read command for checking an operating status of the memory device from the memory controller.

In step S709, the memory device may generate a status code, based on the result of a comparison of the updated read count of the target block and a threshold count. The status code may represent a priority order of a read reclaim operation on the target block with respect to other operations.

In step S711, the memory device may provide the memory controller with a status read response including the status code.

Figure 8:
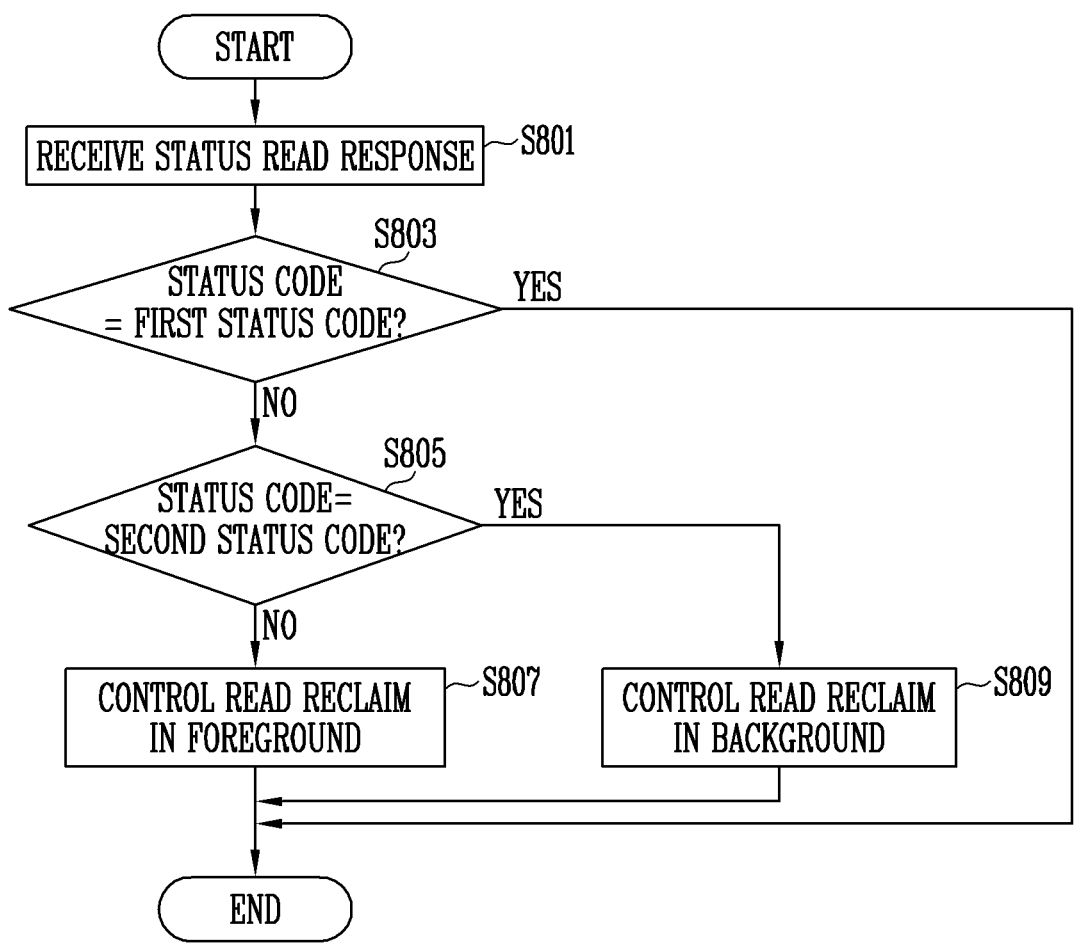
FIG. 8 is a flowchart illustrating an operation of a memory controller in accordance with an embodiment of the present disclosure.

FIG. 8 is a flowchart illustrating an operation of the memory controller in accordance with an embodiment of the present disclosure.

Referring to FIG. 8, in step S801, the memory controller may receive, from the memory device, a status read response including a status code representing a priority order of a read reclaim operation on a target block. Depending on the status code, the read reclaim operation may not be performed, may be performed as a background operation, or may be performed as a foreground operation. The embodiment of FIG. 8 assumes three status codes; however, the invention is not limited to three status codes. When a more coarse indication is acceptable, two status codes may be used. Conversely, when finer distinction is required or desired more than three status codes may be used.

In step S803, the memory controller may determine whether the status code is a first status code. When the status code is the first status code as the determined result, the memory controller ends the operation, as no read reclaim operation is necessary. When the status code is not the first status code, the memory controller proceeds to step S805.

In step S805, the memory controller may determine whether the status code is the second status code. When the status code is the second status code as a result of the comparison, the memory controller proceeds to step S809. When the status code is not the second status code (i.e., when the status code is the third status code), the memory controller proceeds to step S807.

In step S807, the memory controller may control the memory device to perform the read reclaim operation in the foreground, i.e., as a foreground operation. Specifically, the memory controller may immediately provide the memory device with commands for the read reclaim operation. The memory controller may preferentially provide the memory device the commands for the read reclaim operation, as compared with commands generated before the commands for the read reclaim operation.

In step S809, the memory controller may control the memory device to perform the read reclaim operation in the background, i.e., as a background operation. Specifically, the memory controller may generate commands for the read reclaim operation, and store the generated commands in a garbage collection queue. When the memory device is in an idle state, the memory controller may provide the memory device with the commands queued in the garbage collection queue.

In accordance with an embodiment of the present disclosure, the memory controller can determine whether a read reclaim operation on each memory block is to be performed, and if so, how such operation is to be performed, according to the status code received from the memory device. Thus, since it is unnecessary for the memory controller to separately determine whether to perform the read reclaim operation on each memory block, the burden of the memory controller, i.e., overhead, which is to determine whether the read reclaim operation is to be performed can be decreased.

In other words, since the memory device autonomously determines whether a read reclaim operation on each memory block is to be performed and provides the determined information to the memory controller, the memory controller can reduce its overhead and improve its overall operating performance by not expending system resources for determining whether the read reclaim operation on the memory block is to be performed.

Figure 9:
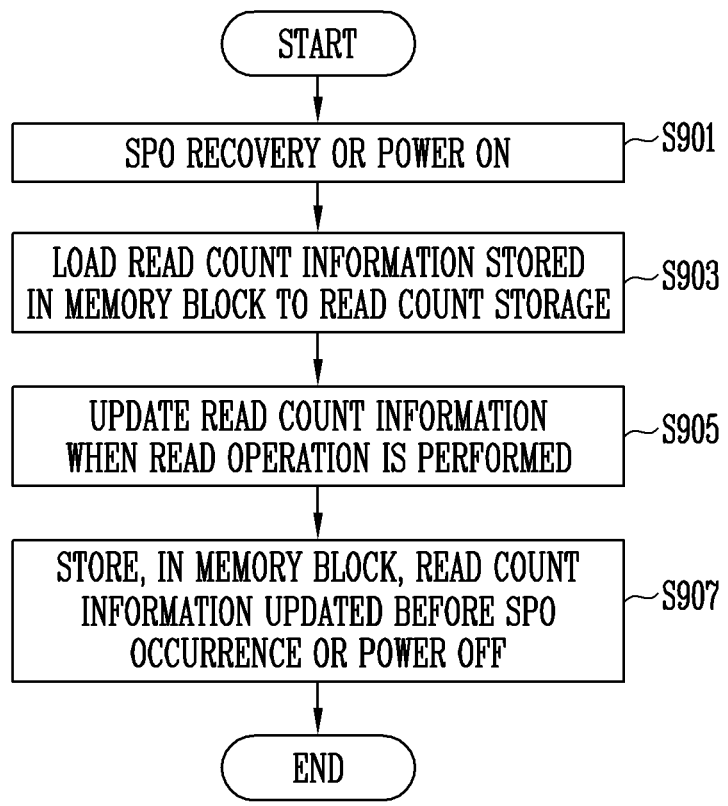
FIG. 9 is a flowchart illustrating management of read count information in accordance with an embodiment of the present disclosure.

FIG. 9 is a flowchart illustrating management of read count information in accordance with an embodiment of the present disclosure.

Referring to FIG. 9, in step S901, the memory device is in a state of recovering from a Sudden Power Off (SPO) which occurs when power of the memory device is suddenly interrupted, or the memory device may be powered on.

In step S903, the memory device may load read count information stored in memory blocks to the read count storage. The read count information may include a read count of each of a plurality of memory blocks in the memory device.

In step S905, the memory device may update the read count information for a particular memory block when a read operation is performed on that memory block. For example, the memory device may update a read count of a target block in the read count information loaded to the read count storage, in response to a read command for the target block.

In step S907, the memory device may store in the memory blocks, read count information updated before SPO or power off.

In an embodiment, the read count storage may be a volatile memory in which stored data disappears when power is interrupted. The memory block may be a nonvolatile memory block in which stored data is retained even when power is interrupted.

In accordance with an embodiment of the present disclosure, through management of the read count information as illustrated in FIG. 9, a read count of each memory block can be managed with continuity, regardless of whether power is supplied to the memory device.

Figure 10:
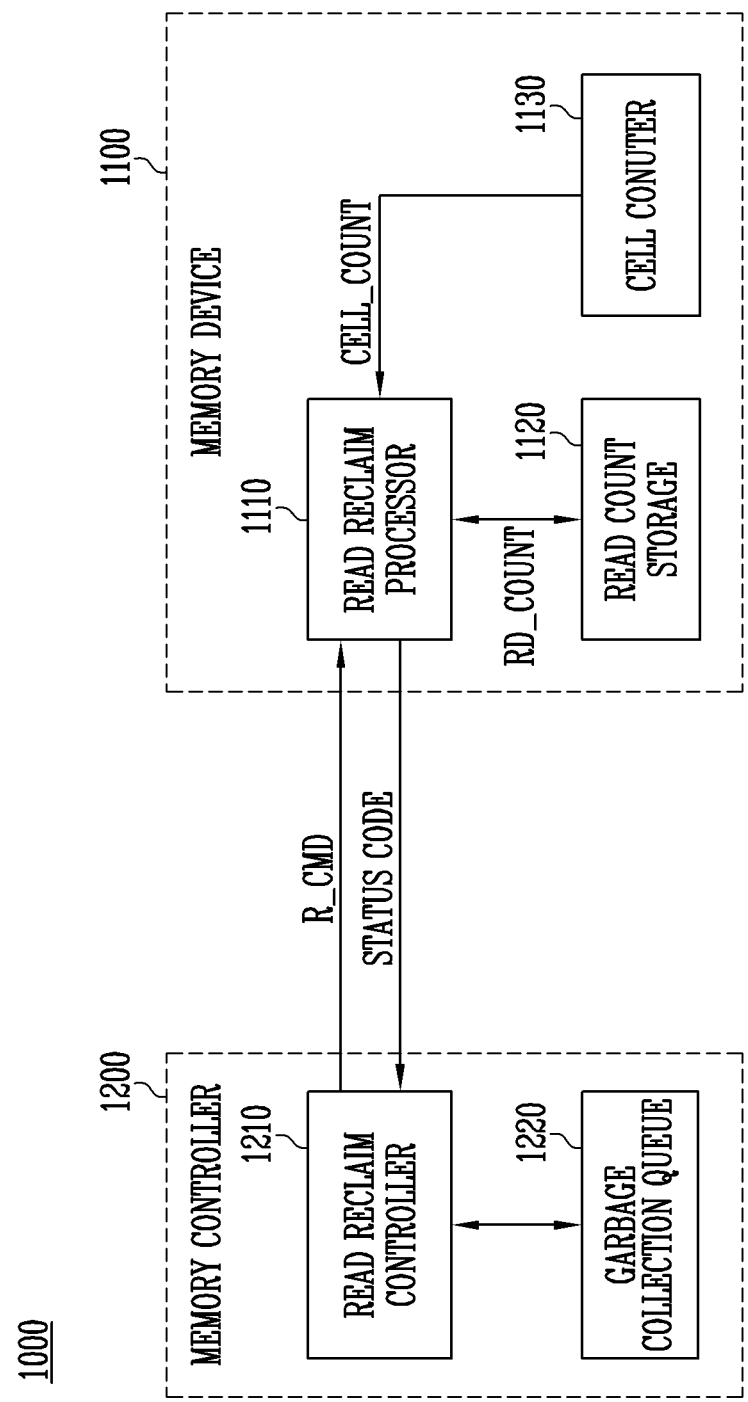
FIG. 10 is a diagram illustrating another example of a configuration and an operation of a storage device, such as that shown in FIG. 1.

FIG. 10 is a diagram illustrating another example of a configuration and an operation of a storage device, such as that shown in FIG. 1. For example, a storage device 1000 shown in FIG. 10 may represent an example of the storage device 50 shown in FIG. 1.

Referring to FIG. 10, the storage device 1000 may include a memory device 1100 and a memory controller 1200. The memory device 1100 may include a read reclaim processor 1110, a read count storage 1120, and a cell counter 1130. The memory controller 1200 may include a read reclaim controller 1210 and a garbage collection queue 1220.

In an embodiment, descriptions of the read reclaim processor 131, the read count storage 132, the read reclaim controller 210, and the garbage collection queue 220, which are shown in FIG. 2, may be equally applied to the read reclaim processor 1110, the read count storage 1120, the read reclaim controller 1210, and the garbage collection queue 1220, which are shown in FIG. 10.

The read reclaim processor 1110 may perform a read operation of a target block in response to a read command R_CMD received from the read reclaim controller 1210. In an embodiment, after the read reclaim processor 1110 performs the read operation, the read reclaim processor 1110 may control the read count storage 1120 to update a read count of the target block.

In an embodiment, after the read reclaim processor 1110 performs the read operation, the read reclaim processor 1110 may compare a read count RD_COUNT with at least one threshold count. The at least one threshold count may increase according to an integer multiple. For example, the at least one threshold count may be a value obtained by dividing a maximum read count set in a memory block at an equal interval. For example, when the maximum read count is 1000, and an interval of threshold counts is a unit of '100,' 10 threshold counts may exist. When the read count RD_COUNT exceeds the at least one threshold count, the read reclaim processor 1110 may determine that a read reclaim operation is necessary. For example, the read reclaim processor 1110 may control the cell counter 1130 to calculate a first memory cell count CELL_COUNT whenever the read count RD_COUNT exceeds each threshold count.

In an embodiment, the read reclaim processor 1110 may receive a first memory cell count CELL_COUNT from the cell counter 1130. The first memory cell count CELL_COUNT may be a number of memory cells read as first memory cells. For example, the first memory cell count CELL_COUNT may be a number of set logic values included in read data acquired from a plurality of memory cell by applying a specific read voltage to the plurality of memory cells. For example, when the first memory cell is an on-cell, the set logic value is '1.' When the first memory cell is an off-cell, the set logic value is '0.' The first memory cell count CELL_COUNT may be a number of '0s' or '1s', included in data read from the plurality of memory cells by using the specific read voltage. Hereinafter, for convenience of description, a case where the first memory cell is an off-cell, and the first memory cell count CELL_COUNT is a number of '0s' included in the read data is assumed and described, but the present disclosure is not limited thereto.

In an embodiment, the read reclaim processor 1110 may determine a status code, based on the first memory cell count CELL_COUNT and a number of correctable error bits.

The status code may represent one of a first status code in which the read reclaim operation is unnecessary, a second status code in which performance of the read reclaim operation is required in background, and a third status code in which performance of the read reclaim operation is required in a foreground.

The number of correctable error bits may represent a number of correctable error bits through error correction decoding among error bits included in the read data. For example, the memory controller 1200 may generate write data by performing error correction encoding on original data provided from the host, and store the write data in the memory device 1100. Subsequently, when data is read from the memory device 1100, the memory controller 1200 may perform error correction decoding on the read data. When a number of error bits included in the read data is equal to or smaller than the number of correctable error bits, the error correction decoding may pass. When the error correction decoding passes, the original data read-requested by the host may be acquired. Therefore, when the error correction decoding passes, the read operation performed by the memory device 1100 may pass. On the contrary, when the number of error bits included in the read data exceeds the number of correctable error bits, the error correction decoding may fail. When the error correction decoding fails, the original data may not be acquired, and the read operation performed by the memory device 1100 may fail. The status code may represent a priority order of the read reclaim operation with respect to the target block.

In an embodiment, the read reclaim processor 1110 may determine the status code according to a ratio of the first memory cell count CELL_COUNT and the number of correctable error bits. Hereinafter, the ratio of the first memory cell count CELL_COUNT and the number of correctable error bits may be designated as an error bit ratio. For example, the read reclaim processor 1110 may determine the status code by comparing the error bit ratio with a plurality of threshold ratios.

The read reclaim processor 1110 may provide the status code to the read reclaim controller 1210. For example, the read reclaim controller 1210 may provide a status read command to the memory device 1100. The status read command may be for checking an operating status of the memory device 1100. The read reclaim controller 1210 may receive a status read response to the status read command from the memory device 1100. The status read response may include the status code.

The read reclaim controller 1210 may control the memory device 1100 to perform the read reclaim operation on the target block, based on the status code. For example, when the status code is the first status code, the read reclaim controller 1210 may not generate any command for the read reclaim operation on the target block. When the status code is the second status code, the read reclaim controller 1210 may generate commands for the read reclaim operation, and store the generated commands in the garbage collection queue 1220. The read reclaim controller 1210 may provide the memory device 1100 with the commands for the read reclaim operation, which are queued in the garbage collection queue 1220, according to whether the memory device 1100 is in an idle state. When the status code is the third status code, the read reclaim controller 1210 may provide the memory device 1100 with the commands for the read reclaim operation more preferentially than commands generated prior to the commands for the read reclaim operation. The memory device 1100 may perform the read reclaim operation according to the commands received form the read reclaim controller 1210.

The read count storage 1120 may store read count information. The read count information may include read counts of a plurality of memory blocks. Whenever a read operation is performed on each of the plurality of memory blocks, the read count information stored in the read count storage 1120 may be updated.

When the read count of the target block exceeds the at least one threshold count, the cell counter 1130 may perform a read operation on at least one page among a plurality of pages included in the target block. For example, the cell counter 1130 may read most significant bit (MSB) data from the at least one page included in the target block by using a first read voltage. The first read voltage may be a voltage for distinguishing an erase state and a first program state from each other.

In an embodiment, the cell counter 1130 may sense a current from the at least one page through the read operation on the MSB data. For example, the cell counter 1130 may sense a current flowing through a page buffer in the read operation on the MSB data. The page buffer may represent the page buffers PB1 to PBm shown in FIG. 3.

The cell counter 1130 may calculate a first memory cell count CELL_COUNT, based on the sensed current. For example, the cell count 1130 may output, as a plurality of digital values, a result obtained by comparing the sensed current with a reference current, and calculate, as the first memory cell count CELL_COUNT, a value obtained by adding up the plurality of digital values. The cell counter 1130 may provide the first memory cell count CELL_COUNT to the read reclaim processor 1110.

Figure 11:
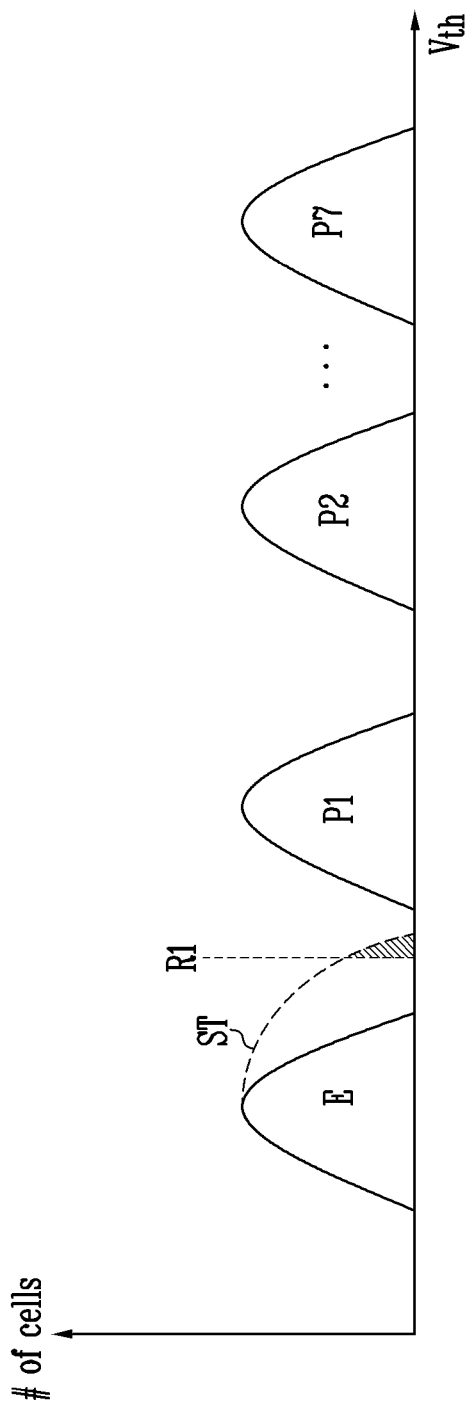
FIG. 11 is a diagram illustrating a read operation using a first read voltage in accordance with an embodiment of the present disclosure.

FIG. 11 is a diagram illustrating a read operation using a first read voltage in accordance with an embodiment of the present disclosure.

A graph shown in FIG. 11 may represent a threshold voltage distribution of programmed memory cells. Specifically, the horizontal axis of the graph represent threshold voltage of memory cells, and the vertical axis of the graph represents number of memory cells.

In FIG. 11, for convenience of description, a case where a memory cell is programmed as a triple level cell is assumed and described, but the present disclosure is not limited thereto.

Memory cells included in one physical page may have a threshold voltage belonging to a threshold voltage distribution of any one state among an erase state E and first to seventh program states P1 to P7 through a program operation.

Meanwhile, a threshold voltage distribution of memory cells may be changed due to various causes. For example, the threshold voltage distribution of memory cells may be increased due to negligence for a long time after the program operation is completed or an excessive operation on another memory area.

In an embodiment, memory cells having the erase state E may have an increased voltage state ST since threshold voltages of the memory cells increase. When MSB data is read by using a first read voltage R1, some (see a slashed portion) of the memory cells having the increase voltage state ST may be read as a second logic value, even though they are to be read as a first logic value.

Accordingly, a larger number of error bits may be included in data sensed by the first read voltage as a change in threshold voltage of memory cells becomes larger. Therefore, a case where the read operation fails may increase.

Figure 12:
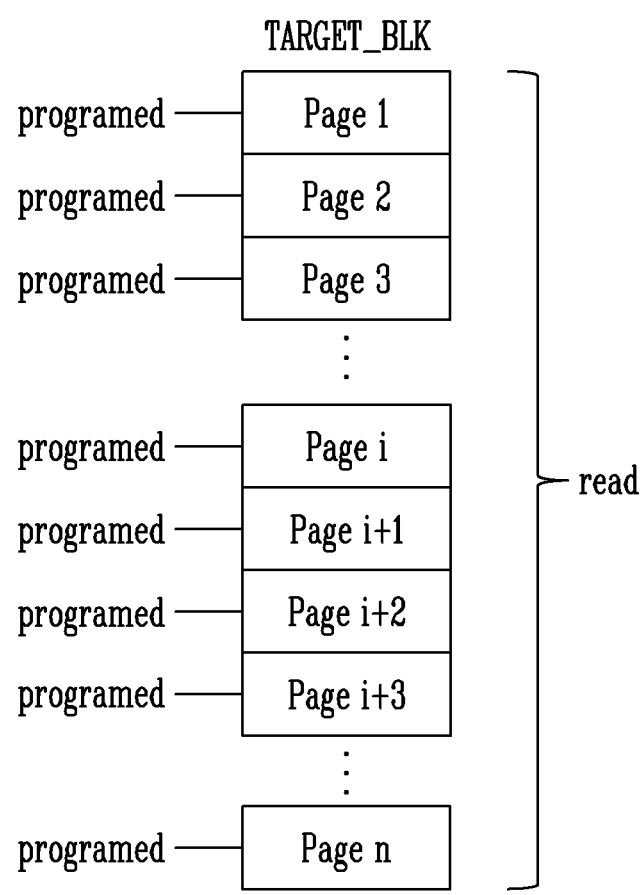
FIG. 12 is a diagram illustrating a read operation when a target block is a closed block in accordance with an embodiment of the present disclosure.

FIG. 12 is a diagram illustrating a read operation when a target block TARGET_BLK is a closed block in accordance with an embodiment of the present disclosure. The closed block may represent a state in which all pages included in a memory block have been programmed.

When the target block TARGET_BLK is the closed block, the cell counter 1130 may read MSB data from a plurality of pages Page 1 to Page n by using the first read voltage. The cell counter 1130 may sense a current flowing through the page buffer in a read operation on the MSB data.

Figure 13:
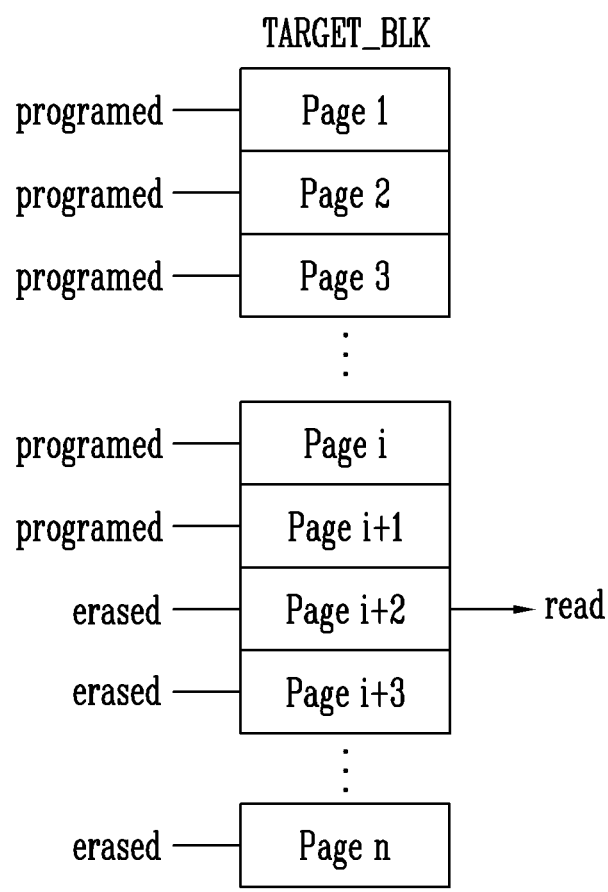
FIG. 13 is a diagram illustrating a read operation when a target block is an open block in accordance with an embodiment of the present disclosure.

FIG. 13 is a diagram illustrating a read operation when a target block TARGET_BLK is an open block in accordance with an embodiment of the present disclosure. The open block may represent a state in which some of pages included in a memory block have been erased. In FIG. 13, it is assumed that the target block TARGET_BLK includes program pages Page 1 to Page i+1 and erase pages Page i+2 to Page n.

When the target block TARGET_BLK is the open block, the cell counter 1130 may read MSB data from an erase page Page i+2 most adjacent to a program page Page i+1 among the plurality of pages by using the first read voltage. The cell counter 1130 may sense a current flowing through the page buffer in a read operation on the MSB data.

Figure 14:
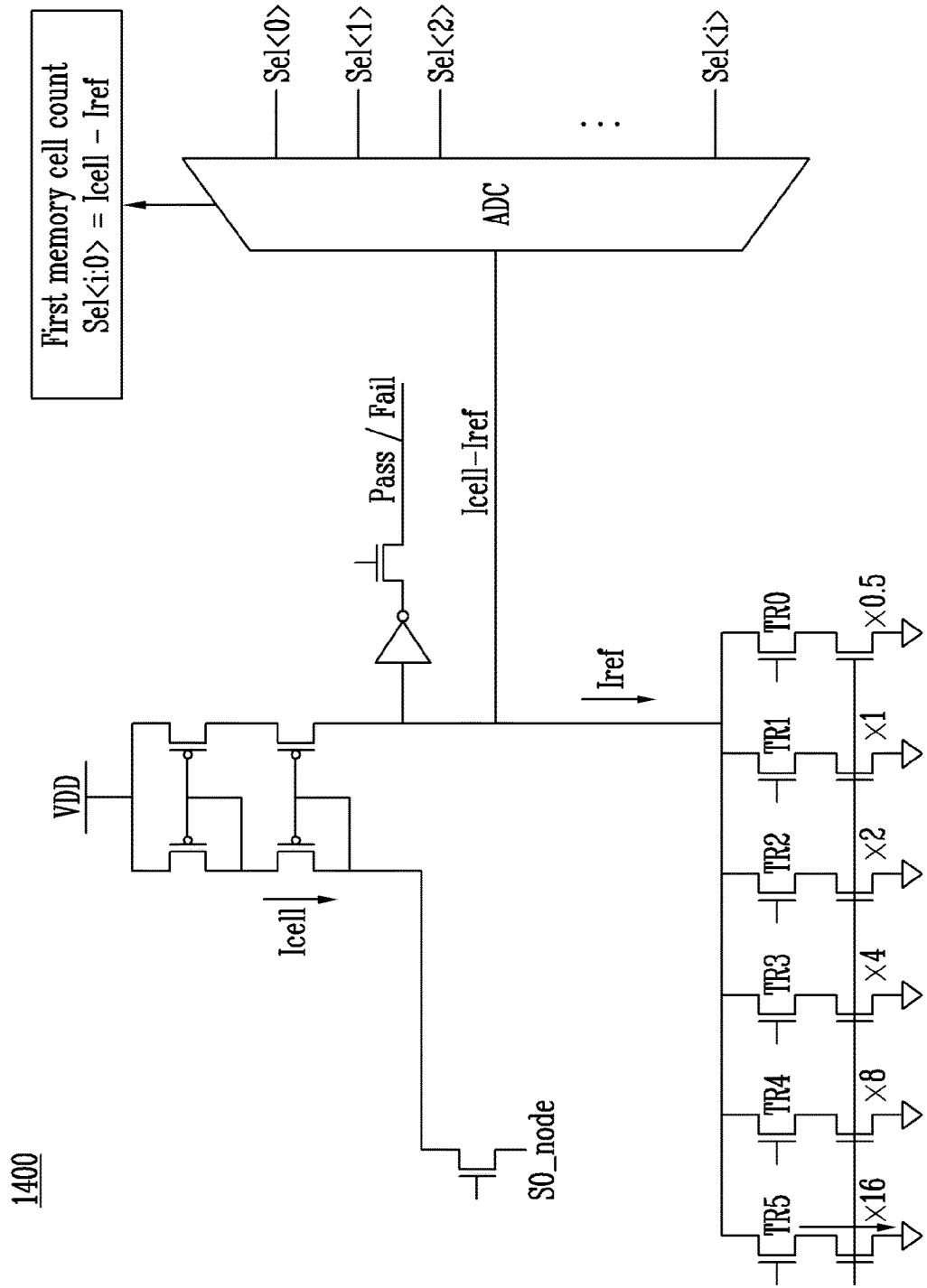
FIG. 14 is a diagram illustrating an example of a cell counter, such as that shown in FIG. 10.

FIG. 14 is a diagram illustrating an example of a cell counter, such that shown in FIG. 10.

A cell counter 1400 shown in FIG. 14 may be implemented by using, for example, a current sensing circuit.

Referring to FIG. 14, transistors included in the cell counter 1400 may receive a power supply voltage through a power node VDD. The cell counter 1400 may acquire a current flowing through a plurality of memory cells to which a read voltage is applied. For example, when the first read voltage is applied to at least one page included in the target block, the page buffer may store data read from the at least one page. The cell counter 1400 may sense a current Icell flowing through the page buffer in a read operation using the first read voltage. For example, the cell counter 1400 may sense the current Icell flowing through a sending node SO_node.

The cell counter 1400 may output a pass signal Pass or a fail signal Fail, based on a result obtained by comparing the sensed current Icell with a reference current Iref. The reference current Iref may have a magnitude adjusted through a plurality of transistors TR0 to TR5. For example, the cell counter 1400 may adjust the magnitude of the reference current Iref from 0.5 time to 16 times through on/off of each of the transistors TR0 to TR5.

In an embodiment, the cell counter 1400 may calculate a first memory cell count, based on the result obtained by comparing the sensed current Icell with the reference current Iref. For example, the result obtained by comparing the sensed current Icell with the reference current Iref may be calculated as an analog value. The cell counter 1400 may output the result obtained by comparing the sensed current Icell with the reference current Iref as a plurality of digital values Sel<i:0> by using an analog-digital converter (ADC). The cell counter 1400 may calculate, as the first memory cell count, a value obtained by adding up the plurality of digital values Sel<i:0>. The cell counter 1400 may provide the calculated first memory cell count to the read reclaim processor 1110.

Figures 15, 16:
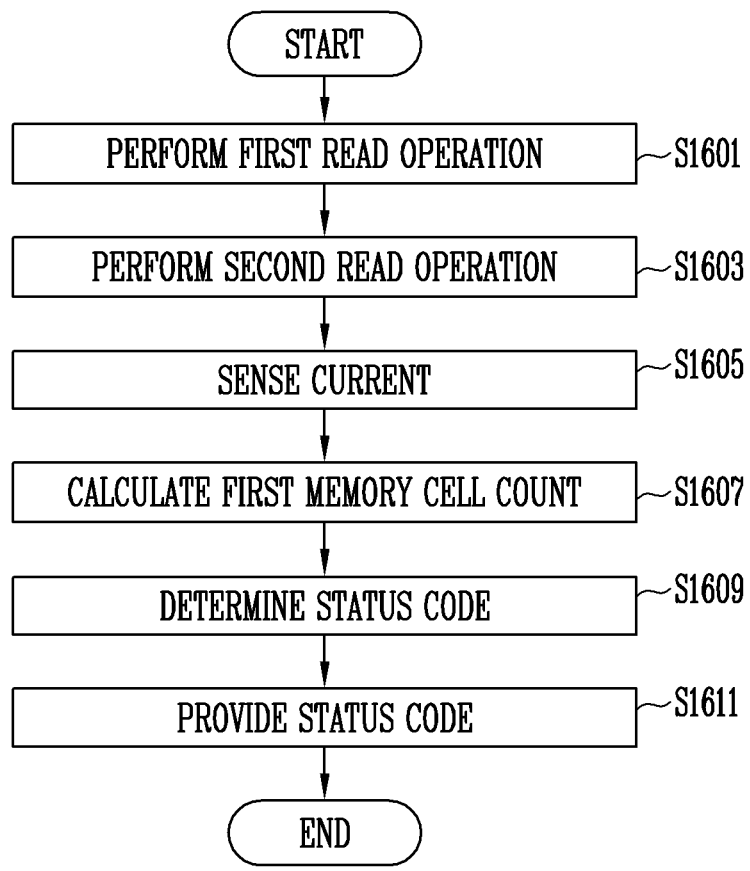
FIG. 15 is a diagram illustrating an example of a status code in accordance with an embodiment of the present disclosure.
FIG. 16 is a flowchart illustrating an operating method of a memory device, such as that shown in FIG. 10.

FIG. 15 is a diagram illustrating an example of a status code in accordance with an embodiment of the present disclosure.

Referring to FIG. 15, a status code may represent a priority order of a read reclaim operation on a target block.

In an embodiment, the status code may represent one of first to third status codes. The priority order of the read reclaim operation may become higher as the status code reaches from the first status code to the third status code. The number of status codes is not limited to this embodiment.

In an embodiment, the status code may be determined based on a result obtained by comparing an error bit ratio x with at least one threshold ratio TH_ratio1 and TH_ratio2. The error bit ratio x may represent a ratio of a first memory cell count and a number of correctable error bits.

For example, when the error bit ratio x is smaller than a first threshold ratio TH_ratio1, the status code may be the first status code. When the error bit ratio x is greater than or equal to the first threshold ratio TH_ratio1 and is smaller than a second threshold ratio TH_ratio2, the status code may be the second status code. When the error bit ratio x is greater than or equal to the second threshold ratio TH_ratio2, the status code may be the third status code.

The first status code may represent a safe state S1 in which the read reclaim operation on the target block is unnecessary. The second status code may represent a critical state S2 in which performance of the read reclaim operation is required in background. The third status code may represent a dangerous state S3 in which performance of the read reclaim operation is required in foreground.

In an embodiment, a value of the first status code may be 00. A value of the second status code may be 01. A value of the third status code may be 10. A value of the status code may be determined as a combination of field values of a specific position among field values constituting a status read response. For example, when the status read response is configured with field values of bit <0:7>, the value of the status code may be determined as a combination of field value <0> and field value <3>. The value of the status code and the determining method are not limited to this embodiment.

FIG. 16 is a flowchart illustrating an operating method of the memory device, such that shown in FIG. 10.

The operating method shown in FIG. 16 may be performed by, for example, the memory device 1100 shown in FIG. 10.

In step S1601, the memory device 1100 may perform a first read operation on a target block in response to a read command received from the memory controller 1200.

In step S1603, the memory device 1100 may perform a second read operation on at least one page among a plurality of pages included in the target block by using a first read voltage according to whether a read count of the target block has exceeded at least one threshold count.

For example, when the read count of the target block exceeds the at least one threshold count, the memory device 1100 may read MSB data from the at least one page by using the first read voltage.

When the target block is a closed block, the memory device 1100 may read MSB data from the plurality of pages by using the first read voltage.

Also, when the target block is an open block, the memory device 1100 may read MSB data from an erase page most adjacent to a program page among the plurality of pages by using the first read voltage.

In step S1605, the memory device 1100 may sense a current from the at least one page in the second read operation.

The memory device 1100 may sense a current flowing through a page buffer in a read operation on the MSB data.

In step S1607, the memory device 1100 may calculate a first memory cell count, based on the sensed current.

The memory device 1100 may output, as a plurality of digital values, a result obtained by comparing the sensed current with a reference current. Also, the memory device 1100 may calculate, the first memory cell count, a value obtained by adding up the plurality of digital values.

In step S1609, the memory device 1100 may determine a status code, based on the first memory cell count and a number of correctable error bits.

For example, the memory device 1100 may determine the status code according to a ratio of the first memory cell count and the number of correctable error bits.

In step S1611, the memory device 1100 may provide the status code to the memory controller 1120.

In accordance with embodiments of the present disclosure, a storage device having improved read reclaim performance and an operating method thereof are provided.

In accordance with embodiments of the present disclosure, a memory device having improved read reclaim performance and an operating method thereof are provided.

While the present invention has been disclosed in the context of various embodiments thereof, it will be understood by those skilled in the art that various changes in form and details may be made therein without departing from the spirit and scope of the present disclosure as defined by the appended claims and their equivalents. Therefore, the scope of the present invention is not limited to the above-described exemplary embodiments but is determined by the appended claims including equivalents thereof.

In the above-described embodiments, not all steps, or parts thereof, necessarily need to be performed. In some instances, the order of one or more steps may be changed. The embodiments disclosed herein are only examples to facilitate an understanding of the present invention, which is not limited to or by the disclosed embodiments. That is, it should be apparent to those skilled in the art that various modifications can be made in light of the present disclosure.

Various embodiments of the present invention have been illustrated and described. Specific terminologies are used only to explain the embodiments of the present disclosure, not to limit the present invention. As will be apparent to those skilled in the art, various modifications can be made to any of the embodiments disclosed herein. The present invention encompasses all such modifications that fall within the scope of the claims.

What is claimed is:

1. A memory device comprising:
a plurality of memory blocks including a plurality of memory cells having a threshold voltage of any one state among an erase state and a plurality of program states;
a read count storage configured to store read count information including read counts of the plurality of memory blocks;
a cell counter configured to, when a read count of a target block among the plurality of memory blocks exceeds at least one threshold count, perform a read operation on at least one page among a plurality of pages included in the target block by using a first read voltage for distinguishing the erase state and a first program state among the plurality of program states from each other, and calculate a first memory cell count as a number of memory cells read as first memory cells having a threshold voltage higher than the first read voltage among memory cells included in the at least one page, based on a current sensed from the at least one page in the read operation; and
a read reclaim processor configured to provide a memory controller with a status code representing a priority order of a read reclaim operation on the target block, based on the first memory cell count and a number of correctable error bits.

2. The memory device of claim 1, wherein the target block is a memory block on which a read operation is performed according to a read command received from the memory controller among the plurality of memory blocks.

3. The memory device of claim 2, wherein the read reclaim processor updates the read count of the target block, which is stored in the read count storage, in response to the read command.

4. The memory device of claim 1, wherein the at least one threshold count increases according to an integer multiple.

5. The memory device of claim 1, wherein the first memory cell is an on-cell or an off-cell.

6. The memory device of claim 1, wherein, when the target block is a closed block, the cell counter reads most significant bit (MSB) data from the plurality of pages by using the first read voltage, and senses the current flowing through a page buffer in a read operation on the MSB data.

7. The memory device of claim 1, wherein, when the target block is an open block, the cell counter reads the MSB data from an erase page most adjacent to a program page among the plurality of pages by using the first read voltage, and senses the current flowing through a page buffer in a read operation on the MSB data.

8. The memory device of claim 1, wherein the cell counter outputs, as a plurality of digital values, a result obtained by comparing the sensed current with a reference current, and calculates, as the first memory cell count, a value obtained by adding up the plurality of digital values.

9. The memory device of claim 1, wherein the read reclaim processor determines the status code according to a ratio of the first memory cell count and the number of correctable error bits.

10. The memory device of claim 1, wherein the status code represents one of a first status code in which the read reclaim operation is unnecessary, a second status code in which performance of the read reclaim operation is required in background, and a third status code in which performance of the read reclaim operation is required in a foreground.

11. A method for operating a memory device including a plurality of memory blocks including a plurality of memory cells having a threshold voltage of any one state among an erase state and a plurality of program states, the method comprising:
performing a first read operation on a target block among the plurality of memory blocks in response to a read command received from a memory controller;
performing a second read operation on at least one page among a plurality of pages included in the target block by using a first read voltage for distinguishing the erase state and a first program state among the plurality of program states from each other according to whether a read count of the target block has exceeded at least one threshold count;
sensing a current from the at least one page in the second read operation;
calculating a first memory cell count as a number of memory cells read as first memory cells having a threshold voltage higher than the first read voltage among memory cells included in the at least one page, based on the sensed current; and
providing the memory controller with a status code representing a priority order of a read reclaim operation on the target block, based on the first memory cell count and a number of correctable error bits.

12. The method of claim 11, wherein the at least one threshold count increases according to an integer multiple.

13. The method of claim 11, wherein the first memory cell is an on-cell or an off-cell.

14. The method of claim 11, wherein the performing of the second read operation includes reading most significant bit (MSB) data from the at least one page by using the first read voltage, when the read count of the target block among the plurality of memory blocks exceeds the at least one threshold count.

15. The method of claim 14, wherein the performing of the second read operation further includes:
reading the MSB data from the plurality of pages by using the first read voltage, when the target block is a closed block; and
reading the MSB data from an erase page most adjacent to a program page among the plurality of pages by using the first read voltage, when the target block is an open block.

16. The method of claim 15, wherein, in the sensing, the current flowing through a page buffer is sensed in a read operation on the MSB data.

17. The method of claim 11, wherein the calculating includes:
outputting, as a plurality of digital values, a result obtained by comparing the sensed current with a reference current; and
calculating, as the first memory cell count, a value obtained by adding up the plurality of digital values.

18. The method of claim 11, further comprising determining the status code according to the first memory cell count and the number of correctable error bits,
wherein the status code represents one of a first status code in which the read reclaim operation is unnecessary, a second status code in which performance of the read reclaim operation is required in background, and a third status code in which performance of the read reclaim operation is required in a foreground.

* * * * *